United States Patent
Forrest et al.

(10) Patent No.: US 7,678,423 B2
(45) Date of Patent: Mar. 16, 2010

(54) SYSTEM AND METHOD FOR DEPOSITING THIN LAYERS ON NON-PLANAR SUBSTRATES BY STAMPING

(75) Inventors: Stephen Forrest, Ann Arbor, MI (US); Xin Xu, Ann Arbor, MI (US); Xiangfei Qi, Ann Arbor, MI (US); Marcelo Davanco, Ann Arbor, MI (US)

(73) Assignees: The Regents of the University of Michigan, Ann Arbor, MI (US); The Trustees of Princeton University, Princeton, NJ (US)

(*) Notice: Subject to any disclaimer, the term of this patent is extended or adjusted under 35 U.S.C. 154(b) by 368 days.

(21) Appl. No.: 11/711,115

(22) Filed: Feb. 27, 2007

(65) Prior Publication Data
US 2008/0202673 A1 Aug. 28, 2008

(51) Int. Cl.
B05D 3/00 (2006.01)
B28B 11/04 (2006.01)
B05C 1/00 (2006.01)

(52) U.S. Cl. .......... 427/294; 427/133; 427/162; 427/256; 427/369; 264/239; 264/259; 264/291; 264/313; 264/320; 156/232; 101/41; 101/405; 101/406; 101/483; 118/50; 118/200; 118/205; 118/264; 118/265

(58) Field of Classification Search ............ 427/133, 427/162, 256, 264, 294–298, 369; 264/239, 264/259, 268, 289.3, 291, 299, 313, 314, 264/316, 319, 320; 156/232; 101/41, 405, 101/406, 483; 118/50, 200, 205, 264, 265
See application file for complete search history.

(56) References Cited

U.S. PATENT DOCUMENTS 6,189,451 B1  2/2001  Pichler (Continued)

FOREIGN PATENT DOCUMENTS

WO  WO 02/14078  2/2002

(Continued)

OTHER PUBLICATIONS

Hur et al., 2004, "Nanotransfer printing by use of noncovalent surface forces: Applications to thin-film transistors that use single walled carbon nanotube networks and semiconducting polymers", Appl. Phys. Lett. 85:5730-5732.

(Continued)

*Primary Examiner*—Michael Cleveland
*Assistant Examiner*—Michael Wieczorek
(74) *Attorney, Agent, or Firm*—Townsend and Townsend and Crew LLP

(57) ABSTRACT

An elastomeric stamp is used to deposit material on a non-planar substrate. A vacuum mold is used to deform the elastomeric stamp and pressure is applied to transfer material from the stamp to the substrate. By decreasing the vacuum applied by the vacuum mold, the elasticity of the stamp may be used to apply this pressure. Pressure also may be applied by applying a force to the substrate and/or the stamp. The use of an elastomeric stamp allows for patterned layers to be deposited on a non-planar substrate with reduced chance of damage to the patterned layer.

15 Claims, 10 Drawing Sheets

U.S. PATENT DOCUMENTS

| | | | |
|---|---|---|---|
| 7,196,366 | B2 | 3/2007 | Forrest et al. |
| 2001/0013294 | A1 | 8/2001 | Bruno et al. |
| 2004/0121568 | A1 | 6/2004 | Kim et al. |
| 2004/0264359 | A1* | 12/2004 | Hayashi et al. .......... 369/275.4 |
| 2006/0130678 | A1 | 6/2006 | Sewell |
| 2008/0202673 | A1 | 8/2008 | Forrest |

FOREIGN PATENT DOCUMENTS

| | | |
|---|---|---|
| WO | WO 2006/117745 | 11/2006 |

OTHER PUBLICATIONS

W. M. Choi et al., "The fabrication of submicron patterns on curved substrates using a polydimethylsiloxane film mould," *Nanotechnology* 15 (2004), p. 1767-1770.

W. R. Childs et al., "Patterning of thin-film microstructures on non-planar substrate surfaces using decal transfer lithography," *Adv. Mater.* 16 (2004), p. 1323-1327.

S. M. Miller et al., "Direct printing of polymer microstructures on flat and spherical surfaces using a letterpress technique," *J. Vac. Sci. Technol. B* 20 (2002), p. 2320-2327.

C. Kim et al., "Micropatterning of organic electronic devices by cold-welding," *Science* 288 (2000), p. 831-833.

C. Kim et al., "Nanolithography based on patterned metal transfer and its application to organic electronic devices," *Appl. Phys. Lett.* 80 (2002), p. 4051-4053.

C. Kim et al., "Fabrication of organic light-emitting devices by low-pressure cold welding," *Adv. Mater.* 15 (2003), p. 541-545.

C. Kim et al., "Patterning of active organic materials by direct transfer for organic electronic devices," *J. Appl. Phys.* 97 (2005), p. 113512-1-6.

G. S. Ferguson et al. "Contact adhesion of thin gold films on elastomeric supports: cold welding under ambient conditions", *Science* 253 (1991), p. 776-778.

B. Michel et al. "Printing meets lithography: soft approaches to high-resolution patterning," *IBM J. Res. Dev.* 45 (2001), p. 697-719.

X. Xu et al., "*Organic Photodetector Focal Plane Arrays Fabricated on Hemispherical Substrates by Three-Dimensional Stamping*," 2007 IEEE LEOS Annual Meeting Conference Proceedings 1, (2007), p. 578-579.

X. Xu et al., "*Direct Transfer Patterning on Three Dimensionally Deformed Surfaces at Micrometer Resolutions and Its Application to Hemispherical Focal Plane Detector Arrays*," Organic Electronics 9, (2008), p. 1122-1128.

X. Xu et al., "*Hemispherical Focal Plane Detector Arrays*," LEOS 2008 Annual Meeting, Paper TuAA 2, Newport Beach, CA (Nov. 2008), p. 1-2.

International Search Report and Written Opinion corresponding to the PCT/US2008/002218 application.

Xia et al., "Soft Lithography" Angewandte Chemie. International Edition, Wiley Vch Verlag, Weinheim, vol. 37, pp. 551-575, 1998.

\* cited by examiner

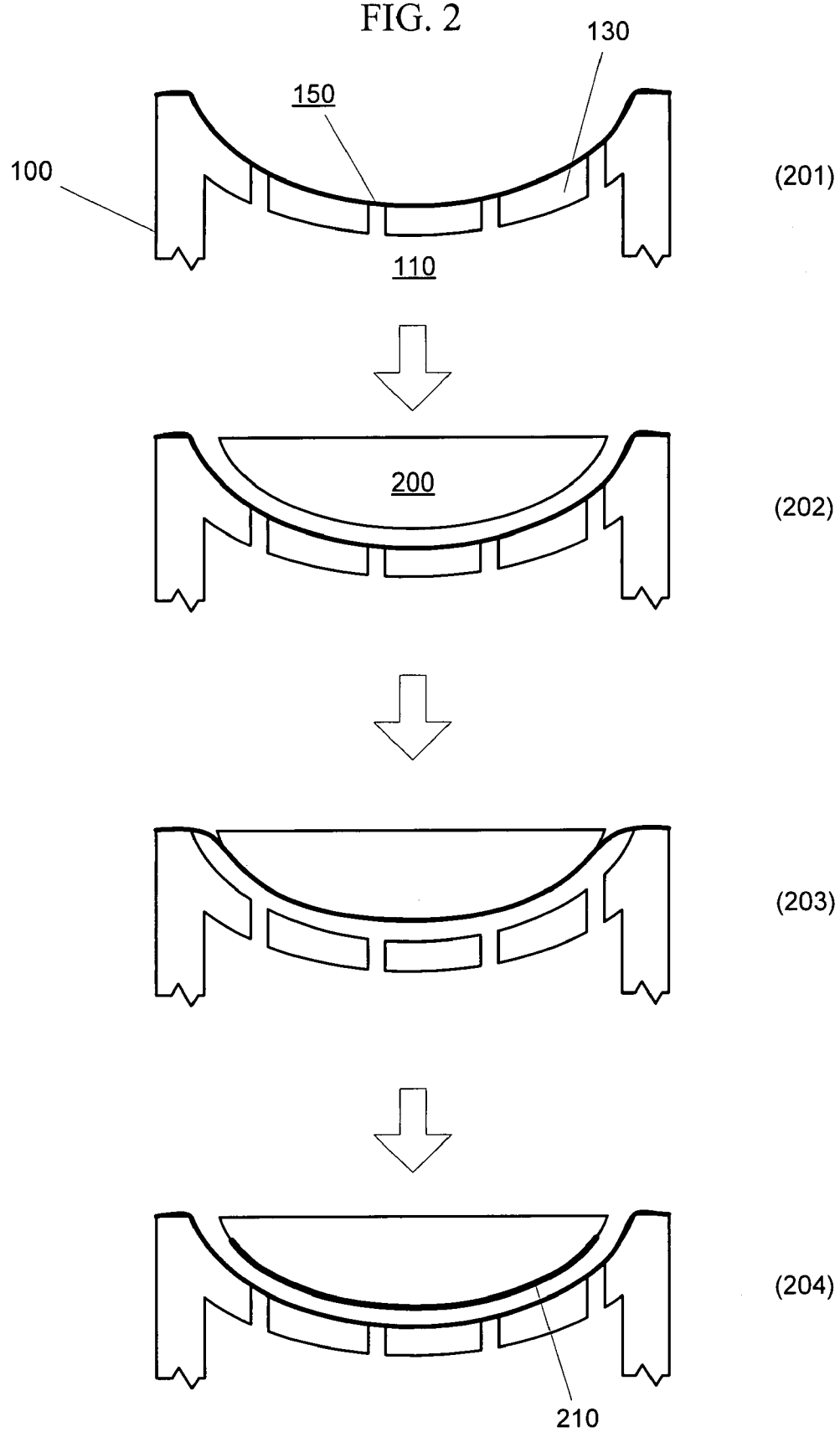

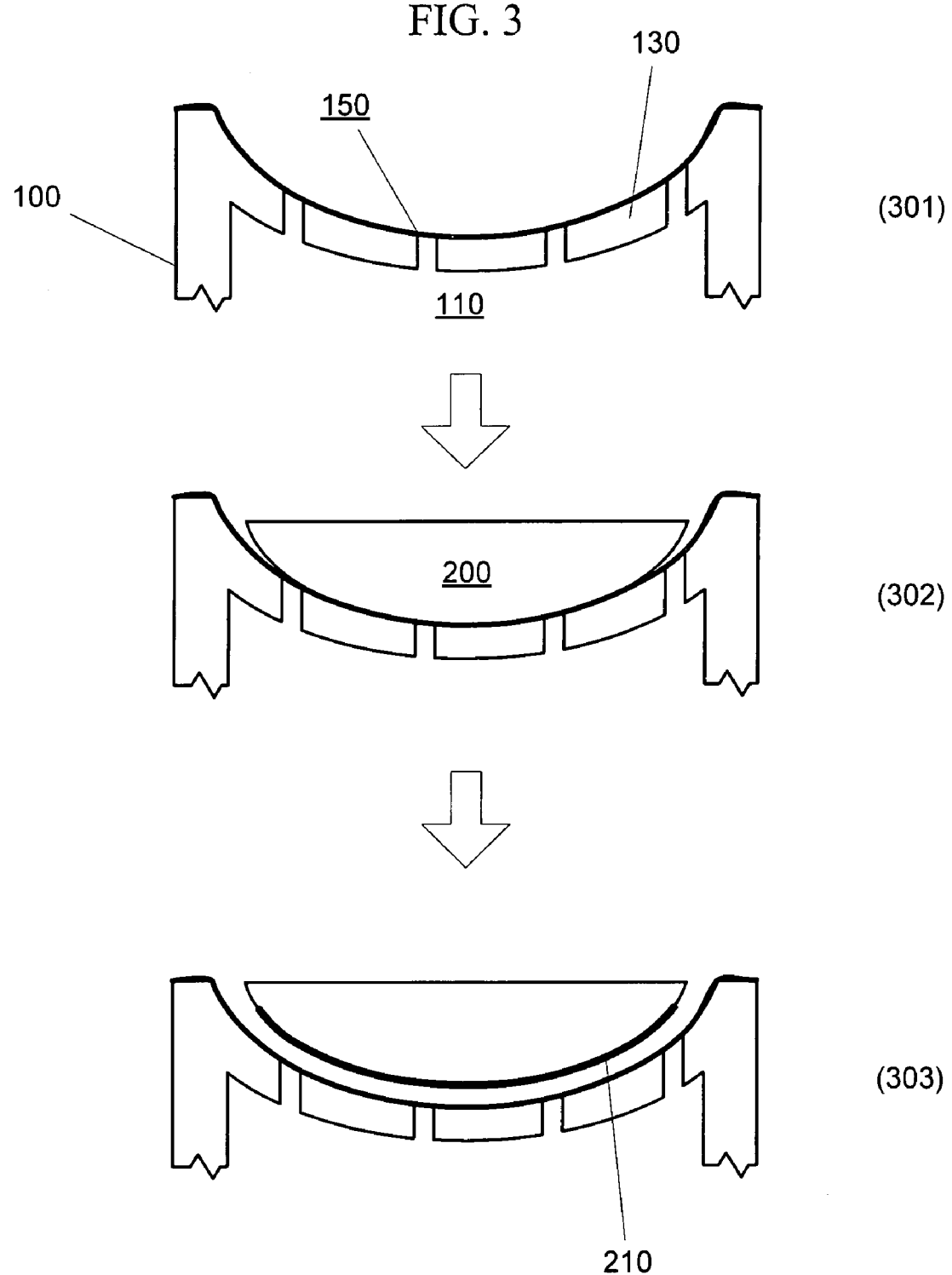

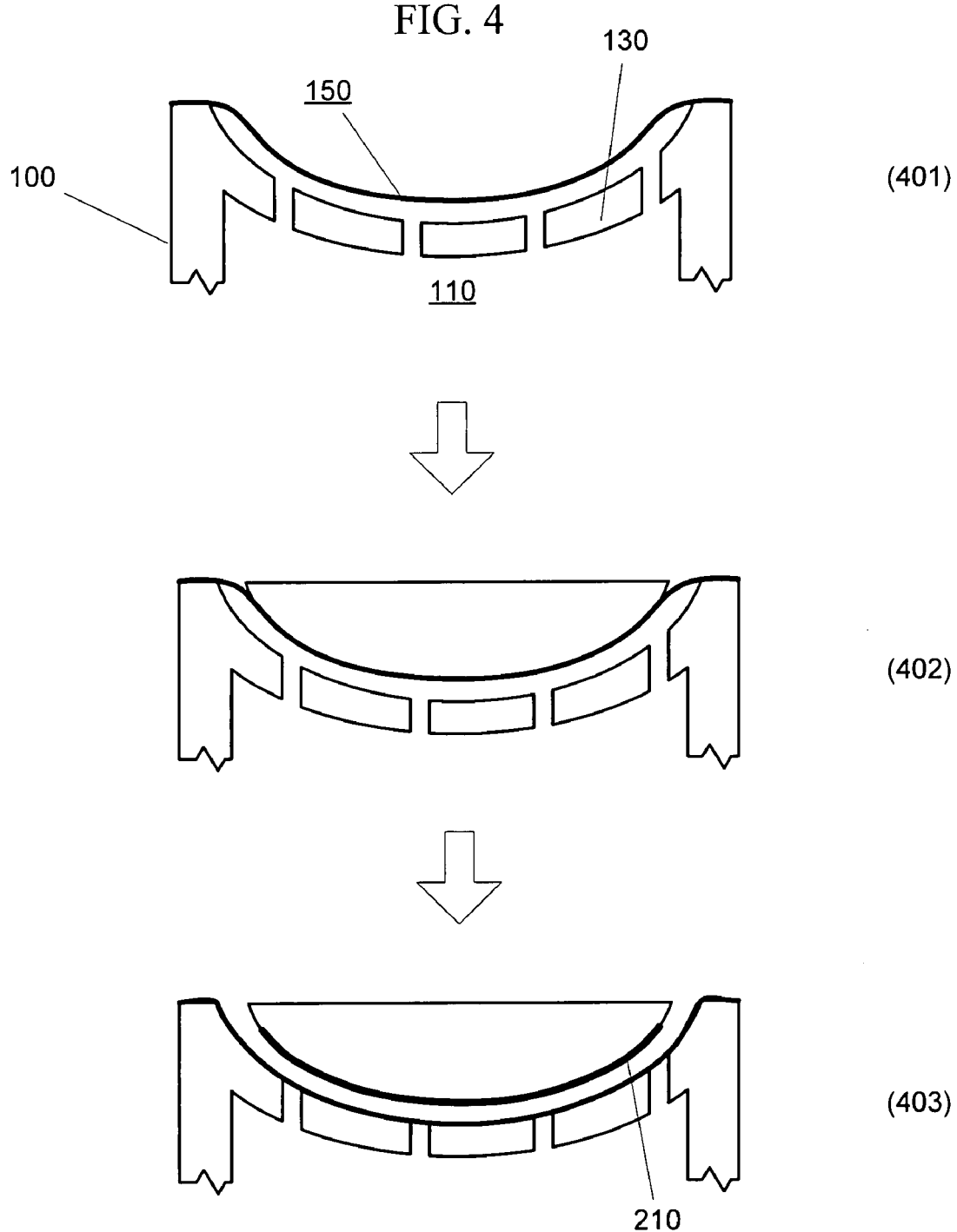

SYSTEM AND METHOD FOR DEPOSITING THIN LAYERS ON NON-PLANAR SUBSTRATES BY STAMPING

GOVERNMENT RIGHTS

This invention was made with U.S. Government support under Contract No. FA9550-06-1-0254 awarded by the Air Force Office of Scientific Research and Contract No.: DMR0213706 awarded by the NSF. The government has certain rights in this invention.

JOINT RESEARCH AGREEMENT

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

FIELD OF THE INVENTION

The present invention relates to depositing material on non-planar substrates using a stamp. More specifically, it relates to depositing metal layers on non-planar substrates using an elastomeric stamp and a vacuum mold.

BACKGROUND

Metals, organics, and other solid materials may be deposited on a flexible substrate, which is then deformed into a desired configuration after the material has been deposited. For example, a metal electrode may be deposited on a flexible substrate for use in an organic light emitting device. However, such a substrate not allow for arbitrarily-shaped devices to be formed since the flexible substrate and/or any layers deposited on the substrate may be damaged or destroyed if the substrate is deformed beyond a certain point. For example, a flexible indium tin oxide (ITO) substrate can be rolled, but can not be formed into a dome or other ellipsoidal shape without damaging the substrate or layers on the substrate. Deposition of material onto a non-planar substrate would be useful for a variety of applications, including organic light emitting and photosensitive devices and other optical applications. However, deposition of material, and specifically patterned layers of material, directly onto a non-planar substrate has not previously been realized.

SUMMARY OF THE INVENTION

An elastomeric stamp may be used to deposit material on a non-planar substrate. The material may be deposited on the stamp while the stamp is in a planar configuration or after the stamp has been deformed to a shape generally the same as the shape of the non-planar substrate. The elastomeric stamp may be deformed with a vacuum mold; when the vacuum is released or decreased the stamp may become less deformed, i.e., more planar. If the substrate is placed on or above the stamp before the vacuum is decreased, the elasticity of the stamp may cause the stamp to come into conformal contact with the substrate. When pressure is applied, the material on the stamp may be transferred to the substrate. Pressure may be applied due to the elasticity of the stamp, by applying a force to the substrate and/or the stamp, or both.

BRIEF DESCRIPTION OF THE DRAWINGS

FIG. 2 shows a vacuum mold and an elastomeric stamp used to deposit a layer of material on a substrate.
FIG. 3 shows a vacuum mold and an elastomeric stamp used to deposit a layer of material on a substrate.
FIG. 4 shows a vacuum mold and an elastomeric stamp used to deposit a layer of material on a substrate.

DETAILED DESCRIPTION

Figure 1A:
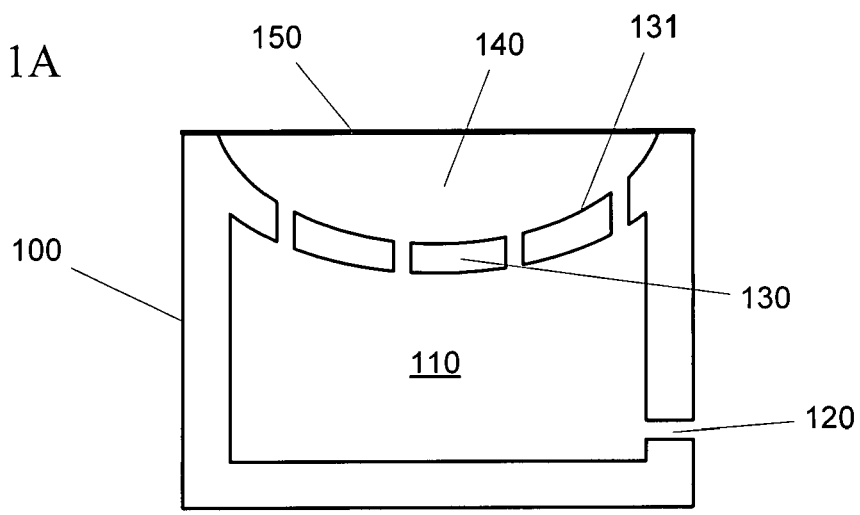
FIG. 1A shows an elastomeric stamp on a vacuum mold.

A vacuum mold has a rigid casing with an opening and an interior cavity connected to a vacuum source. An elastomeric stamp may be placed over the opening and deformed by applying a vacuum to the interior cavity. It has been found that elastomeric stamps may be suited for use in depositing material, and specifically for depositing patterned layers, on a non-planar substrate. Past efforts at depositing layers on non-planar substrates have been rendered difficult or ineffective because the material deposited on a hard, non-elastomeric stamp is prone to cracking or breaking when the stamp is deformed to the shape of the substrate. It is believed that use of an elastomeric stamp as described herein may reduce such problems. The elastomeric stamp may allow for use of a stamp that can be readily coated with material to be deposited after the stamp has been deformed, reducing strain on the coating, or before the stamp has been deformed, for ease of deposition on a planar substrate. It may further allow material on the stamp to "slide" slightly along the stamp surface, preventing strain and damage due to "bunching" of the material when the stamp is deformed. For example, when a non-elastomeric stamp is coated with a metal to be deposited on a substrate and the stamp is deformed such that the metal is on a concave surface of the stamp, the metal coating may move relative to the stamp such that the metal coating covers a relatively smaller fraction of the stamp than when the stamp is in a planar configuration. Thus the metal coating is not stretched by the change in surface area or shape of the stamp, and is less likely to be damaged due to the deformation.

The methods and systems described herein may be particularly useful in the fabrication of small-scale and/or sensitive devices or devices requiring deposition of sensitive materials or layers. For example, they may be preferred for fabricating optoelectronic devices such as photodetectors and organic light emitting diodes (OLEDs). Such devices often use materials that are sensitive to deformation, heat, pressure, and the like. They may also make use of thin layers of metals, such as for electrodes, where it can be desirable for the metal layers to be relatively smooth at the micron or nanometer scale to prevent damage to later-deposited organic layers or other sensitive layers. The sensitivity of these materials may further emphasize the difficulties of depositing thin layers on a non-planar substrate discussed above, since they can be particularly sensitive to substrate damage cause by deformation, stretching, and the like. As described in further detail below, the use of methods and systems described herein may reduce problems inherent in typical methods of deposition when applied to non-planar substrates, allowing for fabrication of optoelectronic devices such as photodetectors and OLEDs. The methods and systems described herein may also be particularly suited to small-scale deposition. For example, they may be useful in depositing layers with a pattern having a smallest dimension of 5 nm to 3 µm.

An exemplary vacuum mold 100 and elastomeric stamp 150 are shown in FIG. 1A. It will be understood that the drawings referred to herein are not drawn to scale, and some features may be exaggerated or omitted for clarity. Although a rectangular mold is shown for illustration purposes, the vacuum mold may be any shape. For example, a cylindrical vacuum mold may have an interior connected to a vacuum source. An elastomeric stamp may be placed over an opening on the side of the cylindrical mold, i.e., the surface that is not a circular end surface. When a vacuum is applied by the vacuum source, the elastomeric stamp may deform into the interior of the cylindrical vacuum mold. Other shapes and configurations of vacuum molds may be used.

A vacuum mold and elastomeric stamp as described herein may be particularly useful for depositing material on a non-planar substrate having two-dimensional curvature, such as a semi-spherical substrate or other non-planar configuration where a roll-to-roll or similar process cannot be used.

The vacuum mold 100 has an interior cavity 110 connected to a vacuum source, such as by a second opening 120 in the vacuum mold. An elastomeric stamp 150 may be placed over the main opening in the vacuum mold 140 and hermetically sealed to the circumference of the opening. When a vacuum is applied to the vacuum mold, the elastomeric stamp may be deformed into the vacuum mold.

Figure 1B:
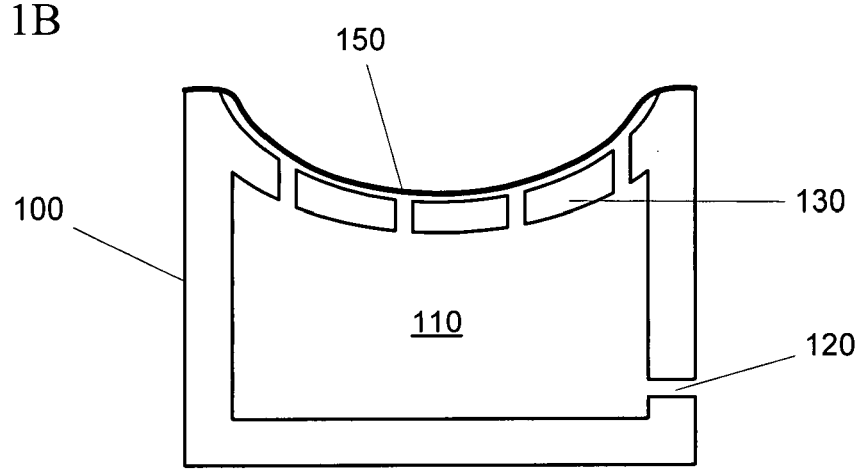
FIG. 1B shows a deformed elastomeric stamp on a vacuum old.

The vacuum mold may have a permeable or semi-permeable surface 130. Such a surface may be desirable to prevent the elastomeric stamp 150 from deforming into the vacuum mold beyond a desired amount. It may also be used to deform the stamp into a specific desired shape, such as when the surface 130 has the same general shape as the substrate on which material is to be deposited. Preferably, it has a surface that is concave in the direction away from the vacuum chamber, such as outer surface 131 shown in FIG. 1A. FIG. 1B shows an elastomeric stamp 150 partially deformed by a vacuum applied to the interior cavity 110 of the vacuum mold 100. As discussed in further detail below, the stamp 150 may be deformed until it comes into contact with the surface 130, or it may be deformed to a configuration between the planar configuration shown in FIG. 1A and a configuration where the stamp is in contact with the surface 130.

Figure 1C:
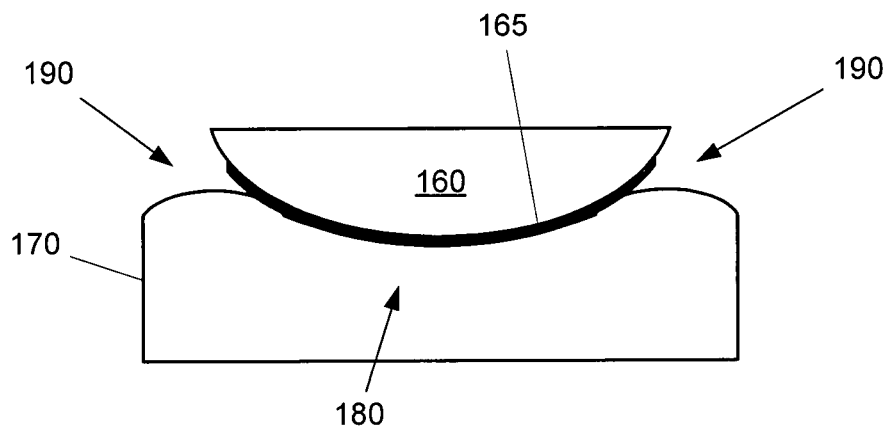
FIG. 1C shows an elastomeric stamp disposed between a substrate and a curved surface.

It may be preferred for the surface 130 to have generally the same shape as a substrate on which material is to be deposited by the elastomeric stamp. For example, if material is to be transferred from the stamp to the substrate due to pressure exerted on the stamp by the substrate, the surface 130 may provide support for the stamp during material transfer. As used herein, when a thin elastomeric sheet is placed between a surface 130 and a substrate surface, and pressure of a degree normally used to transfer material from an elastomeric stamp to a substrate is applied to one or both surfaces, the region of each surface considered to be "generally the same shape" is the region in conformal contact with the elastomeric sheet. For example, referring to FIG. 1C, a substrate 160 is placed over a vacuum mold 170 having an upper surface with sections of varying curvature. When an elastomeric sheet 165 is placed between the substrate 160 and the mold 170 and pressure is applied, portions of the substrate surface and the mold surface are in conformal contact with the elastomeric sheet. In the central region 180, each surface is in conformal contact with the sheet; this region of the surfaces therefore may be described as having the same general shape or being generally the same shape. The outer regions 190 are not in conformal contact with the sheet, and therefore these regions are not generally the same shape.

The degree to which two surfaces are generally the same shape may be quantified based on the degree to which an elastomeric stamp placed between the surface deforms to be in conformal contact with both surfaces. As used herein, two surfaces are generally the same shape if, when an elastomeric stamp is placed between them and pressure typical of the pressure used to transfer material from an elastomeric stamp to a substrate is applied, each surface the elastomeric stamp does not deform more than 1 µm to be in conformal contact with the adjacent surface.

The elastomeric stamp may be used to deposit material on a non-planar substrate. Any non-planar substrate may be used, with substrates having at least one surface with two-dimensional curvature being preferred. The material to be deposited is preferably a metal or a metallic compound, though other materials may be used. The material may be deposited on the stamp while the stamp is in a planar configuration or after the stamp has been deformed to a shape generally the same as the shape of the non-planar substrate. The elastomeric stamp may be deformed with a vacuum mold; when the vacuum is released or decreased the stamp may become less deformed, i.e., more planar. Pressure may be applied to transfer material from the coated stamp to the substrate. Pressure may be applied due to the elasticity of the stamp, by applying a force to the substrate and/or the stamp, or both.

FIG. 2 shows a method of depositing material on a substrate 200 using a vacuum mold 100 and an elastomeric stamp 150. For clarity, only a portion of the vacuum mold in the region of the stamp is shown. Steps 201-204 are indicated by reference numerals shown in parentheses. As previously described, an elastomeric stamp 150 may be placed over an opening in a vacuum mold 100 and hermetically sealed to the edge of the opening. When a vacuum is applied to an internal cavity 110 of the vacuum mold, the elastomeric stamp may be deformed into the mold (201). The stamp 150 may be coated with the material to be deposited before it is deformed, i.e., while in a planar configuration, or it may be coated after being deformed into the vacuum mold.

A non-planar substrate 200 on which material to be deposited is placed above the coated, deformed stamp (202). A substrate having one-dimensional curvature, such as the curved surface of a cylinder, may be used. Preferably, the substrate has two-dimensional curvature. Typically, the substrate has at least one surface that is non-developable. That is, the surface is a topological shape that cannot be flattened onto a plane without distortion such as stretching, compressing, or tearing. The entire substrate may be non-developable, such as where a substrate is created by deforming a thin sheet to have a dome or semi-spherical shape. Pressure may be applied between the substrate 200 and the coated stamp 150 to transfer material from the stamp surface to the substrate. For example, as shown in FIG. 2 the vacuum may be released or decreased. Due to the elastic properties of the stamp, the stamp may then relax until it is in conformal contact with the substrate (203). Other procedures may be used to exert force between the substrate and the stamp. After pressure has been applied between the substrate and the stamp, the stamp may be removed from the substrate. A layer 210 of material is deposited on the substrate surface. The material may be deposited over the entire surface of the substrate such as the curved surface shown in FIG. 2, or it may be deposited on only a portion of the substrate surface.

Material may also be transferred from the stamp to the substrate by directly applying pressure between the stamp and the substrate. FIG. 3 shows a method of depositing a layer of material on a non-planar substrate using an elastomeric stamp. As previously described, the stamp may be deformed and coated with the material to be deposited (301). The stamp 150 may be coated with the material to be deposited before it is deformed, i.e., while in a planar configuration, or it may be coated after being deformed into the vacuum mold. The stamp may be deformed into the vacuum mold 100 until it contacts the surface 130. Preferably, the stamp may contour the surface 130. While the stamp is deformed into the vacuum mold, a substrate 200 may be placed on the stamp (302) and pressure applied between the stamp and substrate to transfer material from the stamp to the substrate. For example, a force may be applied to the substrate. The substrate then may be removed from the stamp (303), with the deposited layer 210.

The vacuum mold may also be used to remove the stamp from the substrate after material is transferred. For example, FIG. 4 shows a process similar to that shown in FIG. 3. In FIG. 4, an elastomeric stamp 150 is fixed in a deformed configuration (401). For example, a planar PDMS stamp may be placed over a vacuum mold, and a vacuum applied to deform the stamp to a desired configuration. Heat may then be applied to fix the stamp in the desired configuration. For example, if a PDMS stamp is heated to about 135° C., it will retain the shape to which it is deformed when the heat is applied. The stamp may be further deformed after being fixed in a deformed configuration, but once the additional deforming force is removed, the stamp will return to the fixed configuration. The stamp may be fixed into a new configuration by further deforming and heating the stamp. Other materials and processes may be used to form a stamp of a desired configuration, such as elastomeric materials that may be fixed by curing with radiation, such as ultraviolet light, heat, chemical reaction, or other processes. The stamp may be coated with a material to be deposited after it has been fixed in a deformed configuration, or it may be coated while in a planar configuration, before it has been fixed in a deformed configuration. A substrate 200 may be placed against the coated, pre-deformed stamp and pressure applied between the stamp and the substrate to transfer material from the stamp to the substrate (402). The coated substrate may then be removed from the stamp (403).

Figure 5:
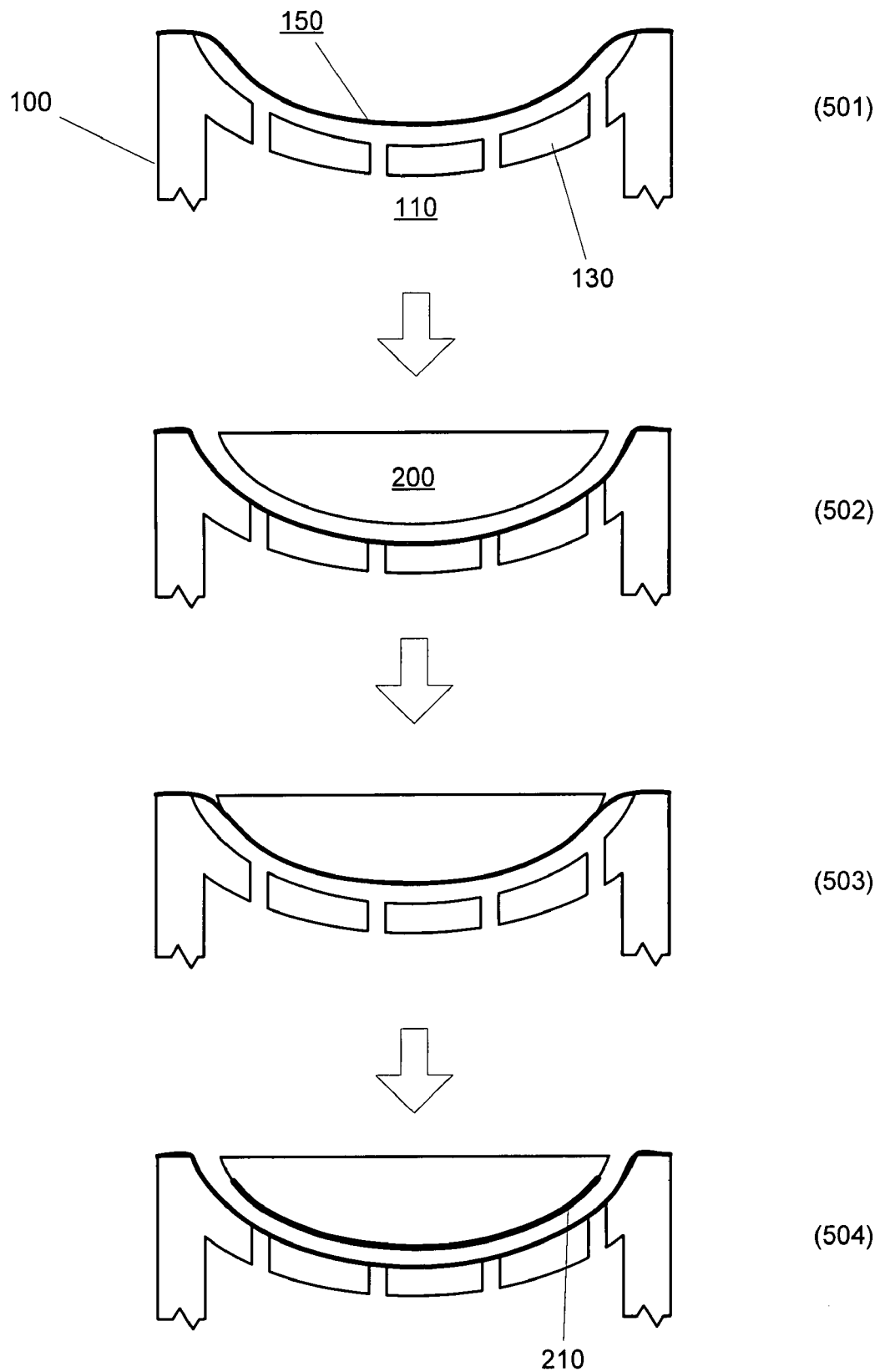
FIG. 5 shows a vacuum mold and an elastomeric stamp used to deposit a layer of material on a substrate.

As previously described with respect to FIG. 2, the elasticity of an elastomeric stamp can also be utilized to exert pressure between the stamp and a non-planar substrate. Referring to FIG. 5, a pre-deformed, coated stamp may be attached to a vacuum mold as previously described with respect to FIG. 4 (501). The pre-deformed stamp may be further deformed into the vacuum mold by application of a vacuum to the vacuum mold and a substrate may be placed over the stamp (502). When the vacuum is reduced or removed, the elasticity of the stamp may cause it to return to the fixed, deformed configuration and come into conformal contact with the non-planar substrate (503). The elasticity of the stamp may further cause the stamp to exert pressure against the substrate, transferring material from the stamp to the substrate. After material has been transferred, a vacuum may be applied to the mold to further deform the stamp and remove the stamp from the substrate (504).

The various method steps shown in FIGS. 2-5 may be performed in an order different than that indicated by the reference numerals. For example, the elastomeric stamp may be coated with the material to be deposited before being placed on and/or hermetically sealed to the vacuum mold. It also may be coated before being deformed and/or fixed in a deformed configuration. Other variations from the illustrated order may be used without affecting the results described herein.

Figure 6:
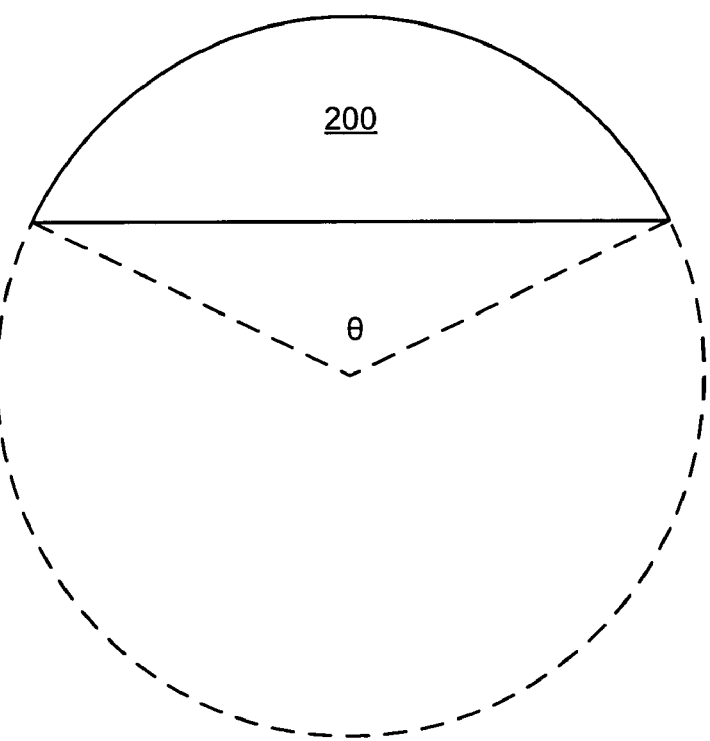
FIG. 6 shows a circular non-planar substrate.
Figure 7A:
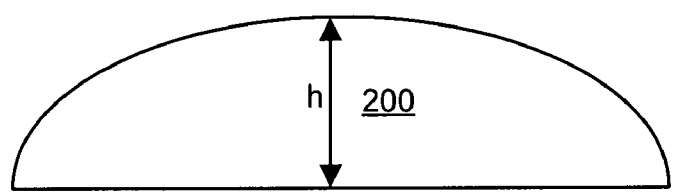
FIG. 7A shows a side cross section of an ellipsoidal substrate.
Figure 7B:
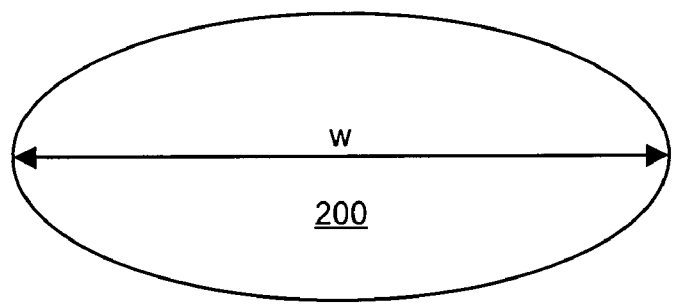
FIG. 7B shows a bottom view of the ellipsoidal substrate shown in FIG. 7A.

Various substrate shapes may be used. Substrates having a surface that is ellipsoidal or semi-spherical may be preferred. An ellipsoidal surface is one formed by rotation of an elliptical curve around an axis. A semi-spherical surface is one having a cross-section that is an arc. A semi-spherical substrate may be characterized by the angle subtended by a cross-section of the substrate. For example, FIG. 6 shows a substrate which subtends an angle of θ. It may be preferred for a circular substrate to subtend an angle of 60-120°. Other shapes may be used. Typically, non-planar substrates will have at least one continuously curved surface. A non-planar substrate may be further characterized by the major axis measured across a flat surface of the substrate, and the maximum height of the substrate measured along a line perpendicular to a flat surface of the substrate to a point on the curved surface of the substrate. FIG. 7A shows a cross-section of a non-planar substrate having a flat surface and a curved surface, with a maximum height of h. FIG. 7B shows a bottom view of the same substrate as in FIG. 7A, with the major axis w identified. For an ellipsoidal substrate having a planar base, the major axis is the same as the major axis of the ellipse formed by the base of the substrate. If a non-planar substrate does not have a planar surface, the major axis may be identified relative to the shape defined by the substrate when viewed from above or below. For example, a thin, dome-shaped or semi-spherical substrate having a convex outer surface and a concave inner surface defines an ellipse or a circle when viewed from below. For other shapes of substrates, the major axis may be identified as the longest distance measured across a flat surface of the substrate or across the shape defined by the substrate when viewed from below. In general it is preferred for the ratio of the maximum height of the non-planar substrate to the major axis of the non-planar substrate to be at least 0.1.

Various processes may be used to effectuate transfer of material from the elastomeric stamp to the substrate while the stamp and the substrate are in contact, such as in configurations (203), (302), (402), or (503). A preferred method of transferring material is the use of cold welding. As used herein, cold welding refers to bonding of like materials at room temperature due to an application of pressure, such as bonding between two metals. Additional information regarding cold welding is provided in U.S. application Ser. No. 10/387,925 filed Mar. 13, 2003 to Kim et al., the disclosure of which is incorporated by reference in its entirety. Properties of the material being deposited may also be used. For example, the substrate and the stamp may be brought into contact for a time sufficient to allow a self-assembled monolayer of the material to form on the substrate. A chemical reaction may also occur or be induced to assist with material transfer or strengthen the bond between the substrate and the deposited material. Additional curing or bonding agents may be used to improve or affect the transfer of material. For example, heat, ultraviolet light, or an oxidizing agent may be applied to the stamp, the substrate, or both. Such agents may be applied in the configurations previously referenced, or they may be applied before the stamp and the substrate are in contact. It may be preferred to treat the stamp, the substrate, or both with a plasma oxidation process prior to placing the substrate on the stamp; such treatment has been found to improve adhesion of the deposited material to the substrate.

Figure 8A:
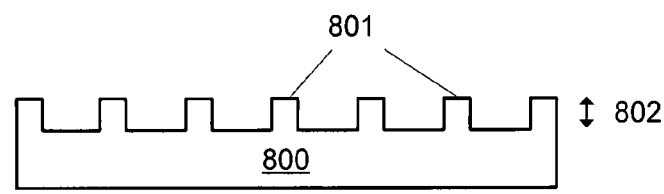
FIG. 8A shows a patterned elastomeric stamp.
Figure 8B:
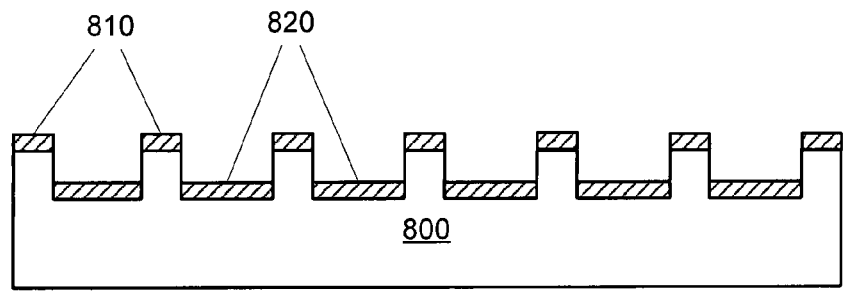
FIG. 8B shows a patterned elastomeric stamp coated with a material to be deposited.
Figure 8C:
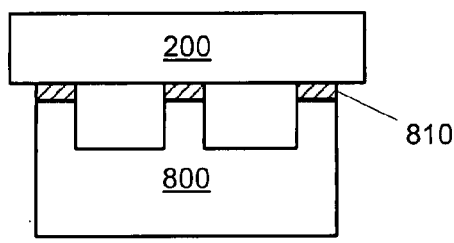
FIG. 8C shows a coated, patterned elastomeric stamp in contact with a substrate.
Figure 8D:
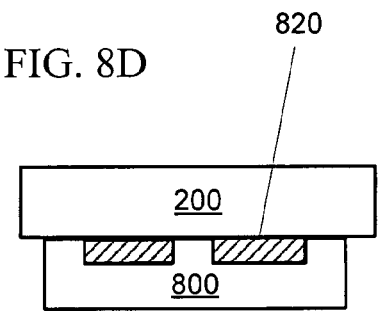
FIG. 8D shows a coated, patterned elastomeric stamp in contact with a substrate.

It may be preferred for the stamp to be patterned, such as when an electrode is to be deposited. The pattern preferably has raised features extending 5 nm to 3 μm from the base of the stamp. FIG. 8A shows an exemplary patterned elastomeric stamp 800 with raised features 801 extending a distance 802 from the base of the stamp. The raised features 801 may all have the same dimensions, or various patterns may be used. As a specific example, when the stamp is used to deposit an electrode for use in an optoelectronic device, the raised features may be arranged in a pattern useful for such an electrode, such as a grid, parallel strips, or other pattern. FIG. 8B shows a patterned elastomeric stamp coated with a material to be deposited on a substrate. The stamp may be coated on the outer surface of the pattern features 810, in the spaces between the pattern features 820, or both, using deposition techniques known in the art. After the pattern is coated, material may be transferred to a substrate 200 by applying pressure between the stamp and the substrate as previously described. FIG. 8C shows a patterned stamp transferring material to a substrate. When the regions between the pattern features are coated, material may be transferred by applying pressure sufficient to compact the stamp and cause these regions to come into contact with the substrate, as illustrated in FIG. 8D. Although FIGS. 8C and 8D illustrate a planar substrate for clarity, it will be understood that a non-planar substrate as previously described may be used.

The elastomeric stamp may be made of any suitable material, with PDMS being preferred. The stamp may be a hybrid stamp, i.e., have multiple layers of different elastomeric materials of varying elasticity or hardness. For example, a stamp may have a hard, less elastic center portion and a soft, more elastic outer portion. The stamp may have a gradient elasticity and/or hardness. Such hybrid stamps may be useful for depositing on substrates having high curvature, since it may be desirable for the inner portions of the stamp to deform more or less easily than the outer portions. The specific configuration of a hybrid stamp may be matched to the degree of deformation each region of the stamp is expected to undergo when depositing material on a specific substrate.

The substrate can be any suitable material, with PETg being preferred. A substrate may contain multiple layers, such as a non-planar PETg dome coated with a uniform layer of metal. The substrate may include additional pre-deposited layers, such as strike layers. It may also be treated, such as with a chemical precursor or radiation, to enhance bonding between the substrate and the material deposited by the stamp. A vacuum mold such as described with respect to FIG. 1A can be used to create a non-planar substrate. Such a process may be desirable to construct a substrate and a deformed elastomeric stamp having the same shape. For example, a PETg substrate may be placed into a vacuum mold having a concave surface, such as surface 130 in FIG. 1, and heated until the substrate contours the surface. The substrate may then be removed and an elastomeric stamp placed in the mold and deformed as previously described. The substrate may then be placed over a coated, deformed stamp to transfer material from the coated stamp to the substrate.

EXPERIMENTAL

A PDMS stamp was replicated from a patterned Si master. A curing agent and PDMS prepolymer (SYLGARD 184 Silicone Elastomer Kit, Dow Corning) was mixed in a 1:7 weight ratio. After degassing in a vacuum box for 10 minutes, the mixture was coated onto the Si master by spinning it at 300 rpm for 30 s. The PDMS prepolymer was cured at 100° C. for one hour, then a 200 μm PDMS stamp was peeled off the master.

A 200 Å Au layer and 10 Å Cr adhesion reduction layer were deposited onto the flexible PDMS stamp by electron-beam deposition. The transmission for the whole metal layers reached 30-40% in the visible wavelength range. The sheet resistance was 150Ω/□, comparable to the conductivity of ITO. If the PDMS mold was planarized by poly(3,4-ethylenedioxythiophene) poly(styrenesulfonate (PEDOT:PSS), the total thickness of metal films could be reduced to 100 Å with the same conductivity. Transmission would be increased to 40-60% in the visible wavelength range.

Gloycol-modified polyethylene terephthalate (PETg) was used to form a spherical substrate due to a relatively low forming temperature of 135° C. The flat PETg substrate was placed on a stainless steel mold such as shown in FIG. 1. The planar PETg substrate was deformed to the shape of the mold by heating at 135° C. for two minutes. The radius of the dome of the mold was 2 cm and the shape was that of an arc subtending an angle of 120°.

Figure 9A:
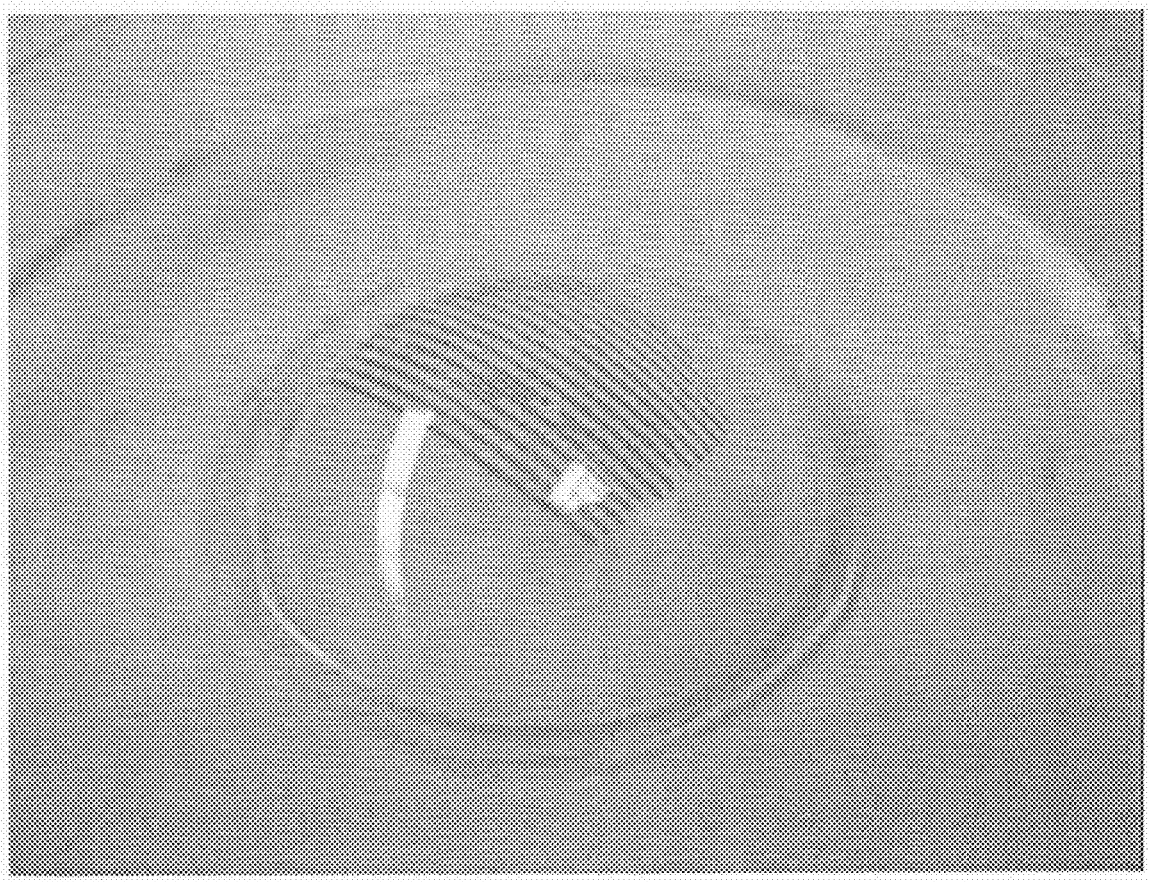
FIG. 9A shows a non-planar substrate with a patterned Au layer deposited on the substrate.
Figure 9B:
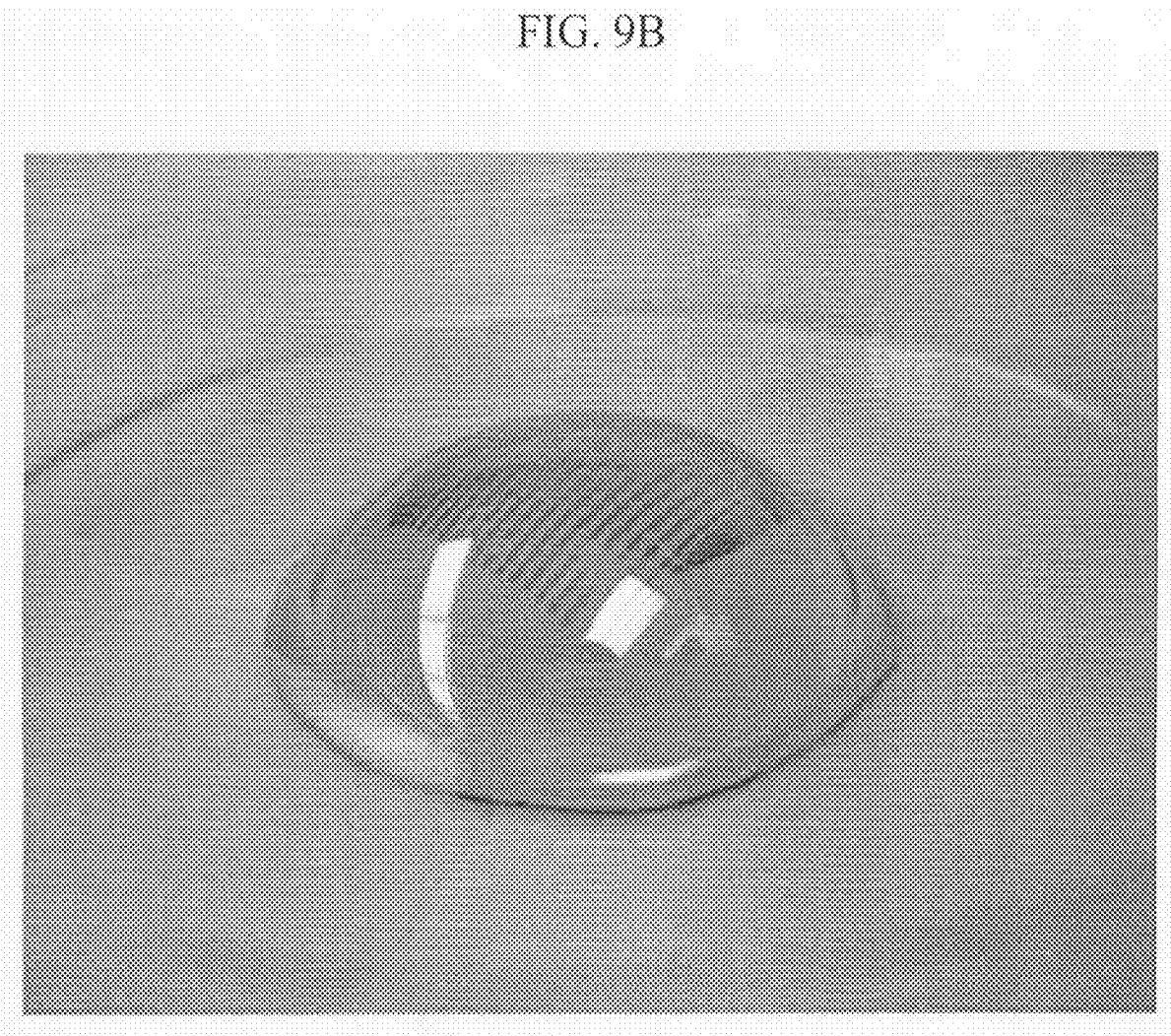
FIG. 9B shows a non-planar substrate with a patterned Ag layer deposited on the substrate.
Figure 9C:
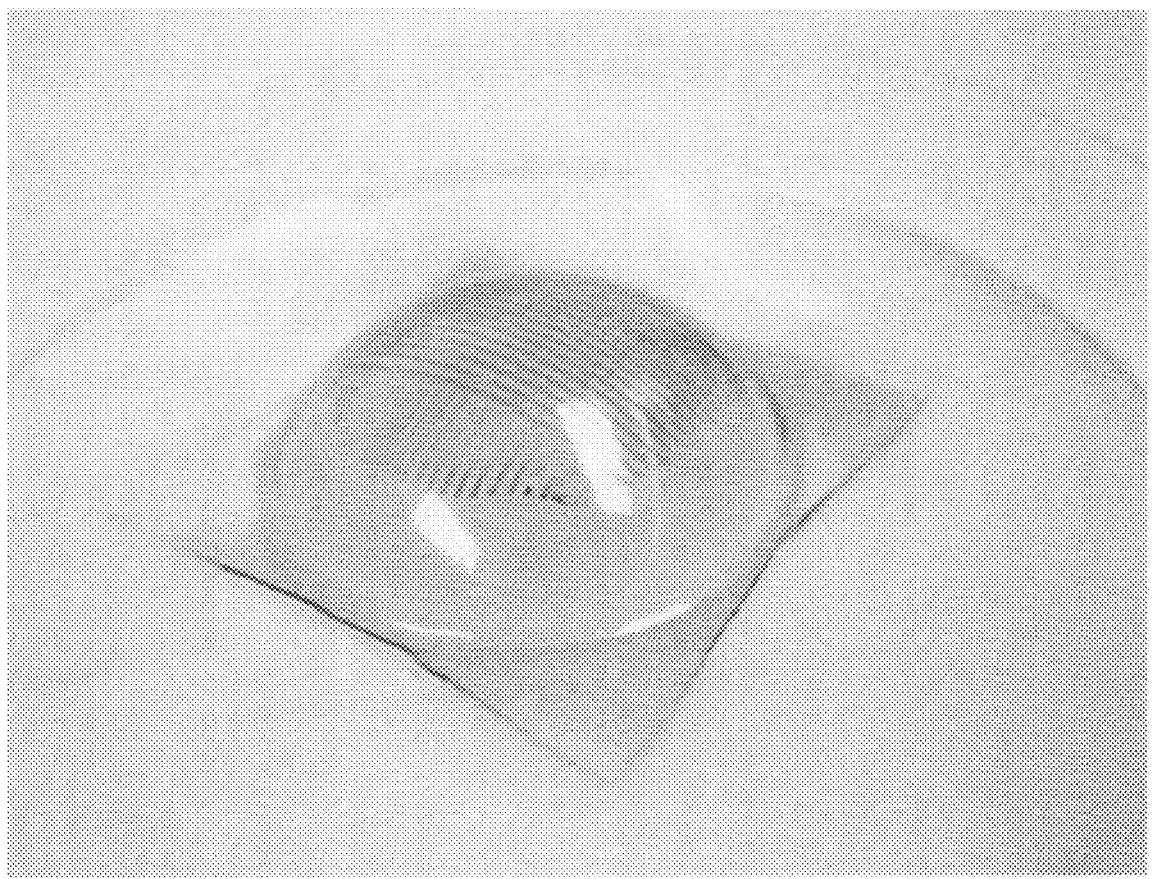
FIG. 9C shows a non-planar substrate with layers deposited in a matrix.

A PDMS mold coated with a thin metal film was deformed in the vacuum mold. A pre-deformed PETg substrate was then placed in the mold opening. The vacuum was decreased, causing the elastomeric PDMS stamp to relax and make conformal contact with the PETg substrate. After heating at 80° C. for 5 minutes, the metal patterns were transferred to the PETg substrate. The vacuum was then reapplied to remove the PETg from the PDMS stamp. Using this method, a 200 Å Au anode and a 500 Å Ag cathode were achieved on PETg substrates, as shown in FIGS. 9A and 9B, respectively. The pattern is 0.4 mm wide with 0.5 mm spacing in between. FIG. 9C illustrates a 16×16 matrix having an Au anode and an Ag cathode.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A method for depositing a solid material on a non-planar substrate, comprising:
   coating a surface of an elastomeric stamp with the material to be deposited;
   applying a vacuum to a vacuum mold to which the elastomeric stamp is hermetically sealed to deform the elastomeric stamp;
   placing the non-planar substrate over the coated, deformed elastomeric stamp;
   transferring the material from the elastomeric stamp to the non-planar substrate by applying a force between the coated, deformed elastomeric stamp and the non-planar substrate and after transferring the material, removing the elastomeric stamp from a deposited layer.

2. The method of claim 1, wherein at least one surface of the non-planar substrate has two-dimensional curvature.

3. The method of claim 1, wherein the surface of the elastomeric stamp is coated with the material to be deposited while the stamp is in a planar configuration.

4. The method of claim 1, wherein the surface of the elastomeric stamp is coated with the material to be deposited while the stamp is in a non-planar configuration.

5. The method of claim 1, wherein the force is applied by reducing the vacuum applied to the vacuum mold while the non-planar substrate is held at a constant position relative to the vacuum mold, until the stamp surface is in conformal contact with the substrate such that the elasticity of the stamp causes the stamp to exert a pressure on the non-planar substrate.

6. The method of claim 1, wherein the vacuum mold has a non-planar surface and the elastomeric stamp deforms to contour the non-planar surface when the vacuum is applied to the vacuum mold.

7. The method of claim 6, wherein the force is applied by pressing the non-planar substrate against the elastomeric stamp while the elastomeric stamp is in contact with the non-planar surface of the vacuum mold, such that the elastomeric stamp is compressed between the non-planar substrate and the non-planar surface of the vacuum mold.

8. The method of claim 1, wherein the non-planar substrate is semi-spherical and subtends an angle of 60°-120°.

9. The method of claim 1, wherein the non-planar substrate is continuously curved, and the ratio of the maximum height of the non-planar substrate to the major axis of the non-planar substrate is at least 0.1.

10. The method of claim 1, wherein applying the force between the coated, deformed elastomeric stamp and the non-planar substrate causes the material to cold weld to the substrate.

11. The method of claim 1, wherein transferring the material from the elastomeric stamp to the non-planar substrate further comprises at least one of: applying heat; utilizing self-assembled monolayer spreading; initiating an oxidation reaction; initiating a chemical reaction; and applying ultraviolet light.

12. The method of claim 1, further comprising applying a vacuum to the vacuum mold to remove the elastomeric stamp from a deposited layer.

13. The method of claim 1, wherein the material to be deposited is a metal.

14. The method of claim 1, wherein the elastomeric stamp is patterned with raised features extending 5 nm to 3 µm from the base of the stamp.

15. The method of claim 1, further comprising applying a plasma oxidation process to the substrate, the elastomeric stamp, or both before the force is applied.

* * * * *